United States Patent
Visconti et al.

(10) Patent No.: US 12,222,835 B2
(45) Date of Patent: Feb. 11, 2025

(54) SYSTEMS AND METHODS TO MANAGE MEMORY DURING POWER DOWN AND STORAGE

(71) Applicant: Micron Technology, Inc., Boise, ID (US)

(72) Inventors: Angelo Visconti, Gentile (IT); John David Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 478 days.

(21) Appl. No.: 17/575,399

(22) Filed: Jan. 13, 2022

(65) Prior Publication Data
US 2023/0222042 A1   Jul. 13, 2023

(51) Int. Cl.
*G06F 11/30* (2006.01)
*G11C 5/14* (2006.01)

(52) U.S. Cl.
CPC ...... *G06F 11/3058* (2013.01); *G06F 11/3037* (2013.01); *G06F 11/3055* (2013.01); *G11C 5/14* (2013.01)

(58) Field of Classification Search
CPC ............ G06F 11/3058; G06F 11/3037; G06F 11/3055; G06F 3/0688; G06F 1/206; G06F 3/0619; G06F 3/0653; G06F 3/0659; G11C 5/14; G11C 7/04; G11C 7/222; G11C 11/4076; G11C 11/221; Y02D 10/00
See application file for complete search history.

(56) References Cited

U.S. PATENT DOCUMENTS

| | | | |
|---|---|---|---|
| 2007/0091710 A1* | 4/2007 | Oh | G11C 7/222 365/233.14 |
| 2018/0101204 A1* | 4/2018 | Fackenthal | G06F 3/0679 |
| 2019/0391759 A1* | 12/2019 | Kang | G11C 13/0004 |
| 2020/0159441 A1* | 5/2020 | Mayer | G11C 5/14 |
| 2020/0258565 A1* | 8/2020 | Schaefer | G11C 11/2275 |

* cited by examiner

Primary Examiner — Jerome Leboeuf
(74) Attorney, Agent, or Firm — Fletcher Yoder, P.C.

(57) ABSTRACT

Systems and methods described herein may enable memory maintenance operations to be performed on a memory device in compliance with a time interval having a duration based on a temperature of the memory device. A system may include a memory device and a memory controller communicatively coupled to the memory device. The memory controller may receive a temperature measurement indicative of a present temperature of the memory device and determine a memory management interval based on the temperature measurement. The memory controller may perform a memory management operation based on the memory management interval. Sometimes, the memory controller powers on the memory device to perform the memory management operation on the memory device.

17 Claims, 3 Drawing Sheets

| TEMPERATURE RANGE (TCASE) | tMMFA | UNITS |
|---|---|---|
| T < 55 | NA | HOURS |
| 55 < T < 65 | 14.75 | HOURS |
| 65 < T < 75 | 4.99 | HOURS |
| 75 < T < 85 | 1.79 | HOURS |
| 85 < T < 95 | 0.68 | HOURS |
| 95 < T < 105 | 0.27 | HOURS |

SYSTEMS AND METHODS TO MANAGE MEMORY DURING POWER DOWN AND STORAGE

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory devices. The techniques and methods described herein may be used with ferroelectric memory devices or other types of memory devices that are to be periodically refreshed. Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous. Some of the memory devices include memory cells that may be accessed by turning on a transistor that couples the memory cell (e.g., the capacitor) with a wordline or a bitline.

FeRAM may use similar device architectures as a volatile memory but may have non-volatile properties due to the use of a ferroelectric capacitor as a storage device. FeRAM devices may thus have improved performance compared to some other non-volatile and volatile memory devices. Some FeRAM relies on splitting sense windows of one storage mechanism to store memory bits, but doing so may provide for storing only 2 states per memory cell.

Keeping the foregoing in mind, a volatile memory may be periodically refreshed to preserve data stored in memory cells of the volatile memory. However, the volatile memory may become more sensitive to data loss when in an environment of increasing temperatures. When left unmitigated, a previous suitable refresh scheme may result in inadvertent data loss. Moreover, some types of memory may be more likely to imprint, or prefer one memory state over other memory states, which may lead to data errors if left unmitigated.

BRIEF DESCRIPTION OF THE DRAWINGS

Various Aspects of this Disclosure May be Better Understood Upon Reading the Following Detailed Description and Upon Reference to the Drawings in which.

DETAILED DESCRIPTION

Figure 1:
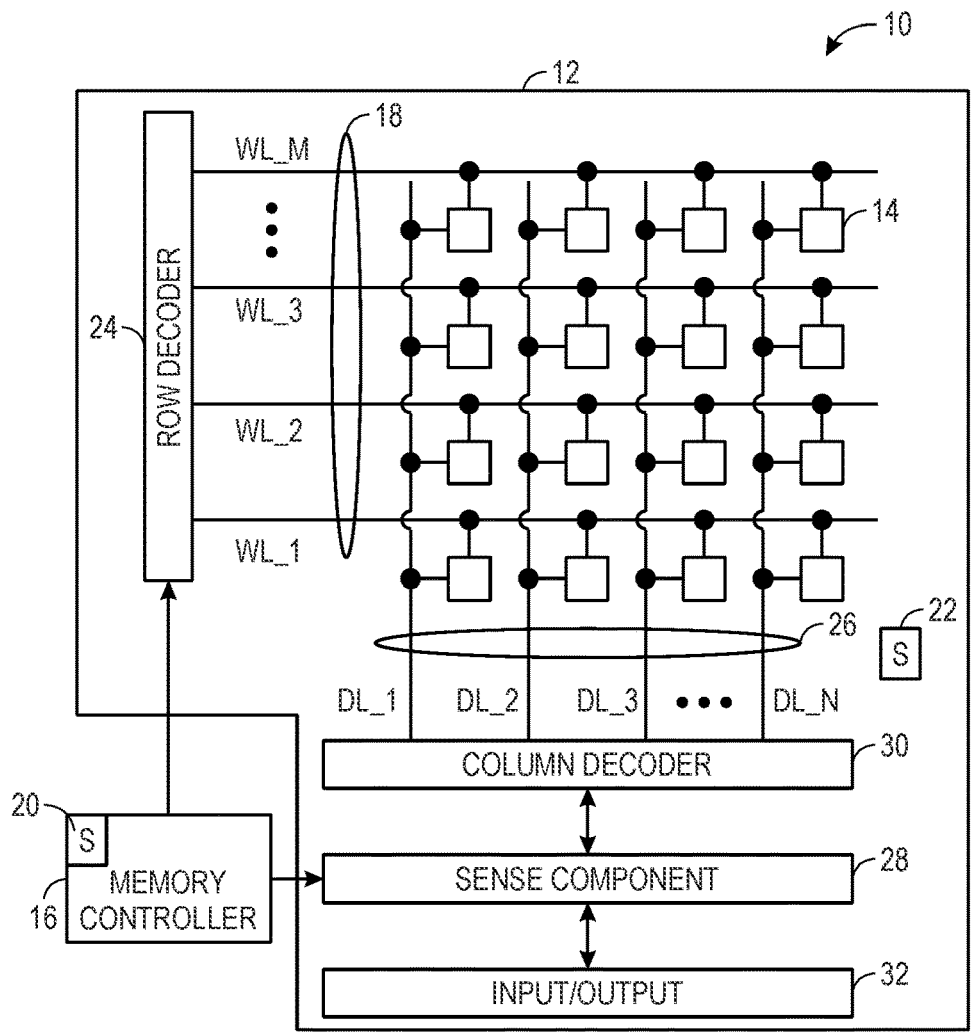
FIG. 1 is an example of a memory array, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Different memories may use different memory architectures to store and retrieve data bits using different memory states. In some embodiments, each memory state may refer to a distinct distribution of charges on a memory cell. For example, each memory cell of a ferroelectric random access memory (FeRAM) may include a ferroelectric capacitor including ferroelectric material. The ferroelectric capacitor may store memory states using charge dipoles of the memory cell (e.g., positive and negative charge distributions). A state of such memory cells may be written to or read from by applying a voltage. In specific embodiments, the applied voltage may flip the memory cell dipole. Such memory cells may use a reference voltage, as a threshold, to distinctively identify whether a positive or negative charge distribution (e.g., dipole) is being written or sensed. In some embodiments, an intermediary memory state (e.g., third memory state) may be programmed and sensed using an intermediary charge distribution between the positive and negative charge distributions. Indeed, some memory cells may include two reference voltages and store and sense three distinct memory states.

Keeping the foregoing in mind, a volatile memory may be periodically refreshed to preserve data stored in memory cells of the volatile memory. However, the volatile memory may become more sensitive to data loss when in environments of increasing temperatures. When left unmitigated, a previously suitable refresh scheme may result in inadvertent data loss. However, a likelihood for data loss in environments with changing temperatures may be reduced when refresh operations are performed on configurable intervals based on the temperature of the volatile memory.

Indeed, some memories, like FeRAM memories, are to be periodically refreshed to maintain data integrity. However, certain conditions may have effects on the rate at which data is lost in memory. For example, the greater the temperature of a memory device, the quicker memory loss may occur. Due to this, if a memory cell is kept at a high temperature for too long of a time period without any management, the data stored in the memory cell may be lost. During normal device operations, internal memory management operations manage refreshing of the memory devices. However, these operations may omit the case when the memory device is entering into a power down state (e.g., PDN-Z mode) or entering into a power on state while at a higher temperature. For example, data may be lost if a memory device is exposed to high temperature for a prolonged period of time after it is powered down, or even powered off, in some cases. These systems and methods described herein may benefit a variety of memory systems, including both two-dimensional and three-dimensional memory systems and component devices.

One way to manage refresh operations while the memory device is entering the power down state is by observing a time interval corresponding to a time used to perform memory management of a full array (tMMFA). The tMMFA parameter may be adjusted dynamically during operation of the device in response to temperature changes of the memory device. When observed, refreshing at the time interval defined by the tMMFA dramatically reduces a likelihood of memory loss occurring from waiting too long to refresh the memory device at a given temperature as well as an elimination of the possibility of imprinting certain cells in the FeRAM memory with a preferred data state. The tMMFA may indicate to a memory controller to refresh the memory device according to shorter time intervals when the temperature is relatively greater. Additional descriptions are made below regarding benefits to adjusting a periodicity at which the temperature data is updated based on temperature gradients indicating relatively how fast the temperature is changing.

Referring now to FIG. 1, a memory array 10 is illustrated in accordance with various examples of the present disclosure. The memory array 10 includes a number of memory cells, including a memory cell 14, that are programmable to store different states, such as two, three, or more memory states. The memory cell 14 may be programmable with data having a voltage value that corresponds to a logical high binary data or to a logical low binary data.

A memory device 12 may include the memory array 10 and the memory cells. A memory controller 16 may communicate with the memory device 12 to perform read operations, write operations, and refresh operations. The memory controller 16 may include a tangible, non-transitory computer readable medium programmed with instructions that, when executed by a processor, cause the memory controller 16 to perform operations described herein.

The memory cell 14 may include a capacitor that has a ferroelectric as the dielectric material to store a charge representative of the programmable states. For example, the capacitor may represent three memory states using three distinct charge levels.

Memory operations, such as reading and writing memory states, may be performed on the memory cell 14 by activating or selecting the appropriate word line 18 and digit line 26. Activating or selecting a word line 18 or a digit line 26 may include applying a voltage to the respective lines. Word lines 18 and digit lines 26 are made of conductive materials. For example, word lines 18 and digit lines 26 may be made of metals (such as copper, aluminum, gold, tungsten, etc.), metal alloys, other conductive materials, or the like. According to the example of FIG. 1, each row of the memory cells is connected to a single word line 18, and each column of the memory cells is connected to a single digit line 26.

By applying a voltage to the word line 18 and the digit line 26, a single memory cell may be activated (or accessed) at their intersection. Accessing such memory cell may include performing reading or writing operation on the memory cell. The intersection of a word line 18 and digit line 26 may be referred to as an address of a respective memory cell.

In some architectures, the memory state storage of the memory cell 14 (e.g., the capacitor) may be electrically isolated from the digit line by a selection component. The word line 18 may be connected to and may control the selection component. For example, the selection component may be a transistor and the word line 18 may be connected to the gate of the transistor. Activating the word line 18 results in an electrical connection or closed circuit between the capacitor of a memory cell 14 and its corresponding digit line 26. The digit line 26 may then be accessed to either read or write the memory cell 14. In some examples, the word line 18 may be activated multiple times to facilitate sensing. In some cases, the word line 18 may be activated a first time to facilitate sensing of a first charge of a first type (e.g., dielectric charge) and a second time to facilitate sensing of a second charge of a second type (e.g., polarization charge). In some cases, the first time and the second time may be discontinuous or separated in time.

Accessing the memory cell 14 may be controlled through a respective row decoder 24 and a respective column decoder 30. In some examples, a row decoder 24 receives a row address from the memory controller 16 and activates the appropriate word line 18 based on the received row address. Similarly, a column decoder 30 receives a column address from the memory controller 16 and activates the appropriate digit line 26. For example, memory array 10 may include multiple word lines 18, labeled WL_1 through WL_M, and multiple digit lines 26, labeled DL_1 through DL_N, where M and N depend on the array size. Thus, by activating a word line 18 and a digit line 26 (e.g., WL_2 and DL_3), the memory cell 14 at their intersection may be accessed.

Upon accessing, the memory cell 14 may be read, or sensed, by sense component 28 to determine the stored state of the memory cell 14. A capacitor of a targeted memory cell 14 may be discharged to induce a change in voltage of a corresponding digit line 26 to the targeted memory cell 14. The column decoder 30 may receive signals transmitted via the digit line 26 and may transmit the signals onto the sense component 28 for further processing. The sense component 28 may compare the signals to a reference voltage to determine the stored state of the targeted memory cell 14, where a voltage greater than a first reference voltage may indicate a logical high state and a voltage less than a second reference voltage may indicate a logical low state. In some cases, a single reference voltage may be used to differentiate between a logical high state and a logical low state, where a voltage greater than the single reference voltage indicates a logical high state and a voltage less than or equal to the single reference voltage indicates a logical low state. Additional reference voltages may be used based on a number of states capable of being stored in the targeted memory cell 14. The sense component 28 may include various transistors or amplifiers in order to detect and amplify a difference in the signals. The memory cell 14 may be set, or written, by activating the relevant word line 18 and digit line 26. As discussed above, activating a word line 18 electrically connects the corresponding row of memory cells to their respective digit lines 26. By controlling the relevant digit line 26 while the word line 18 is activated, the memory cell 14 may be written—i.e., a memory state may be stored in the memory cell 14. The column decoder 30 may accept data, for example at input 32, to be written to the memory cells 14. The memory cell 14 may be written by applying a voltage across the ferroelectric capacitor 46. This process is discussed in more detail below.

In some cases, the memory cell 14 may be written after a read operation to write back data that has been read from the cell (or, alternatively, from other cells in some cases) or to refresh data. In some cases, a write operation may include writing a first charge (e.g., a first polarization charge) and a second charge (e.g., a dielectric compensation charge) to the memory cell 14. In some cases, writing one charge to the memory cell 14 may be based on a voltage of a cell plate relative to a voltage of one or more other components (e.g., a sense amplifier). In some cases, writing a first charge (e.g., a polarization charge) to a memory cell may occur before, during an overlapping interval, or at the same time as writing the second charge (e.g., a dielectric compensation charge) to the memory cell. In some cases, a write operation may be based on setting a polarization state, a dielectric state, or both, or by flipping one or more digits using cell or component selection.

In some memory architectures, accessing the memory cell 14 may degrade or destroy the stored logic state and re-write or refresh operations may be performed to return the original logic state to the memory cell 14. In DRAM, for example, the capacitor may be partially or completely discharged during a sense operation, corrupting the stored logic state. As such, the logic state may be re-written after a sense operation. Additionally, activating a single word line 18 may result in the discharge of all memory cells in the row; thus, several or all memory cells in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, the ferroelectric memory cells (e.g., memory cells 14) may have beneficial properties that may result in improved performance relative to other memory architectures.

The memory controller 16 may control the operation (e.g., read, write, re-write, refresh, etc.) of the memory cells 14 through the various components, such as the row decoder 24, the column decoder 30, and the sense component 28. The memory controller 16 may generate row and column address signals in order to activate the desired word line 18 and digit line 26. The memory controller 16 may also provide and control various voltage levels used during the operation of memory array 10. In general, the amplitude, shape, or duration of an applied voltage discussed herein may be adjusted or varied and may be different for the various operations for operating the memory array 10. Furthermore, one, multiple, or all memory cells within the memory array 10 may be accessed simultaneously; for example, multiple or all cells of the memory array 10 may be accessed simultaneously during a reset operation in which all memory cells, or a group of memory cells, are set to a single logic state.

In some embodiments, refresh operations may be based on sensed data generated by sensing devices associated with memory. The memory controller 16 may be communicatively coupled to a first sensing device 20 and the memory device 12 may include a second sensing device 22 on a same chip as the memory device 12. The first sensing device 20 may be thermally coupled to the memory controller 16 and the second sensing device 22 may be thermally coupled to the memory device 12. For example, the first sensing device 20 may be in thermal contact or include a component that is in thermal contact with the memory controller 16 and/or may be on a same board, chip, package, and the like, as the memory controller 16 is assembled. Similarly, the second sensing device 22 may be in thermal contact with the memory device 12 and/or may be on a same board, chip, package, and the like, as the memory device 12 is assembled. In some cases, the first sensing device 20 and/or the second sensing device 22 may be thermally coupled to a portion of the board, chip, package or the like of the memory device 12 and/or memory controller 16. In some cases, the memory device 12 and/or the memory controller 16 may be physically wholly or partially disposed on, formed in, and/or integrated in the board, chip, package or the like. It is also noted that any manufacturing method may be used to form the first sensing device 20, the second sensing device 22, the memory device 12, and/or the memory controller 16 in general and/or to attach the component to the respective board, chip, package, or the like, including, for example, chemical vapor deposition (CVD), physical assembly, or the like. In any case, the first sensing device 20 and the second sensing device 22 may provide a temperature measurement that is indicative of a temperature of the memory device 12. Thus, the memory controller 16 may use an indication of the temperature from the first sensing device 20 or from the second sensing device 22 with a method to generally obtain the temperature of the memory device 12.

Figure 2:
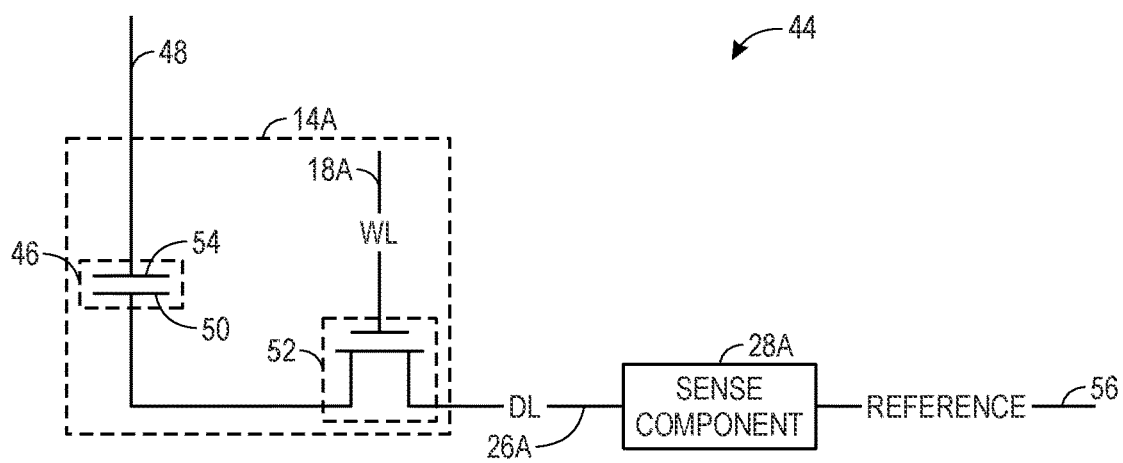
FIG. 2 illustrates an example circuit that supports accessing, sensing, and other operations of a memory, in accordance with an embodiment of the present disclosure.

FIG. 2 illustrates a circuit 44 that supports accessing, sensing, and other operations of the memory device 12 in accordance with various examples of the present disclosure. The circuit 44 includes a ferroelectric memory cell 14A, word line 18A, digit line 26A, and sense component 28A, which may be examples of the memory cell 14, word line 18, digit line 26, and sense component 28, respectively, as described with reference to FIG. 1.

The ferroelectric memory cell 14A may include a logic storage component, such as ferroelectric capacitor 46 that has a first plate, cell plate 54, and a second plate, cell bottom 50. The cell plate 54 and the cell bottom 50 may be capacitively coupled through a ferroelectric material positioned between them. The orientation of cell plate 54 and cell bottom 50 may be flipped without changing the operation of the ferroelectric memory cell 14A. The circuit 44 may also include a selection component 52 and reference voltages 56. In the example of FIG. 2, the cell plate 54 may be accessed via the plate line 48 and the cell bottom 50 may be accessed via the digit line 26A. As described above, various states may be stored by charging or discharging the ferroelectric capacitor 46.

The stored state of the ferroelectric capacitor 46 may be read or sensed by operating various elements represented in the circuit 44. The ferroelectric capacitor 46 may be in electronic communication with the digit line 26A. For example, the ferroelectric capacitor 46 can be isolated from the digit line 26A when the selection component 52 is deactivated, and the ferroelectric capacitor 46 can be connected to the digit line 26A when the selection component 52 is activated. Activating the selection component 52 may be referred to as selecting the ferroelectric memory cell 14A.

In some cases, the selection component 52 is a transistor and its operation is controlled by applying a voltage to the transistor gate, where the voltage magnitude is greater than the threshold magnitude of the transistor. The word line 18A may activate the selection component 52; for example, a voltage applied to the word line 18A is applied to the transistor gate, connecting the ferroelectric capacitor 46 with the digit line 26A.

A fixed or constant voltage may be applied to the cell plate 54 using the plate line 48. This operation may be referred to as "fixed cell plate." In order to read the memory state of a ferroelectric memory cell 14A, for example, the digit line 26A may be virtually grounded and subsequently isolated from virtual ground prior to applying a voltage to the word line 18A. Selecting the ferroelectric memory cell 14A may result in a voltage difference across the ferroelectric capacitor 46, since the plate line 48 is held at a finite voltage and the digit line 26A is virtually grounded. The voltage difference may be the induced voltage or sensed voltage discussed above. Moreover, the voltage difference value may refer to one of multiple sensing voltages, corresponding to one of multiple distinct charge distributions in the ferroelectric memory cell 14A, and indicative of the multiple memory states. As a result, the voltage of the digit line 26A may change (e.g., become some finite value). In some embodiments, this induced voltage may be compared at the sense component 28A with a first reference voltage and a second reference voltage of the reference voltages 56 to determine a memory state.

To write to the memory cell 14A, a voltage may be applied across the ferroelectric capacitor 46 to induce accumulation of the respective amount of charges. Various methods may be used to induce accumulation of the respective amount of charges. In one example, the selection component 52 may be activated through word line 18A in order to electrically connect the ferroelectric capacitor 46 to the digit line 26A. A voltage may be applied across the ferroelectric capacitor 46 by controlling the voltage of the cell plate 54 (through the plate line 48) and the cell bottom 50 (through the digit line 26A). The differential voltage between the cell plate 54 and the cell bottom 50 may be driven to the first sensing voltage to write the first memory state. A similar process may be performed to write the second memory state.

Keeping the foregoing in mind, volatile memory may be periodically refreshed or otherwise processed using other memory management techniques. Although data integrity of a memory may worsen when exposed to high temperatures for a suitable amount of time, memory management operations involved with preserving data of a volatile memory while the memory is being powered off do not typically account for ambient temperatures. Memory systems operated without consideration for temperatures during these transitionary power states may be susceptible to data loss. Operations may improve, and data may become more likely to be preserved, when operating the volatile memory using memory management operations that are based on a temperature of the memory. For example, one way to manage refresh operations while the memory device is entering the power down state is by observing a time interval corresponding to a time used to perform memory management of a full array (tMMFA), where the time interval may be selected based on a temperature corresponding to a temperature of the memory. Indeed, a smaller tMMFA parameter may correspond to a higher temperature of the memory device 12.

Figures 3, 4:
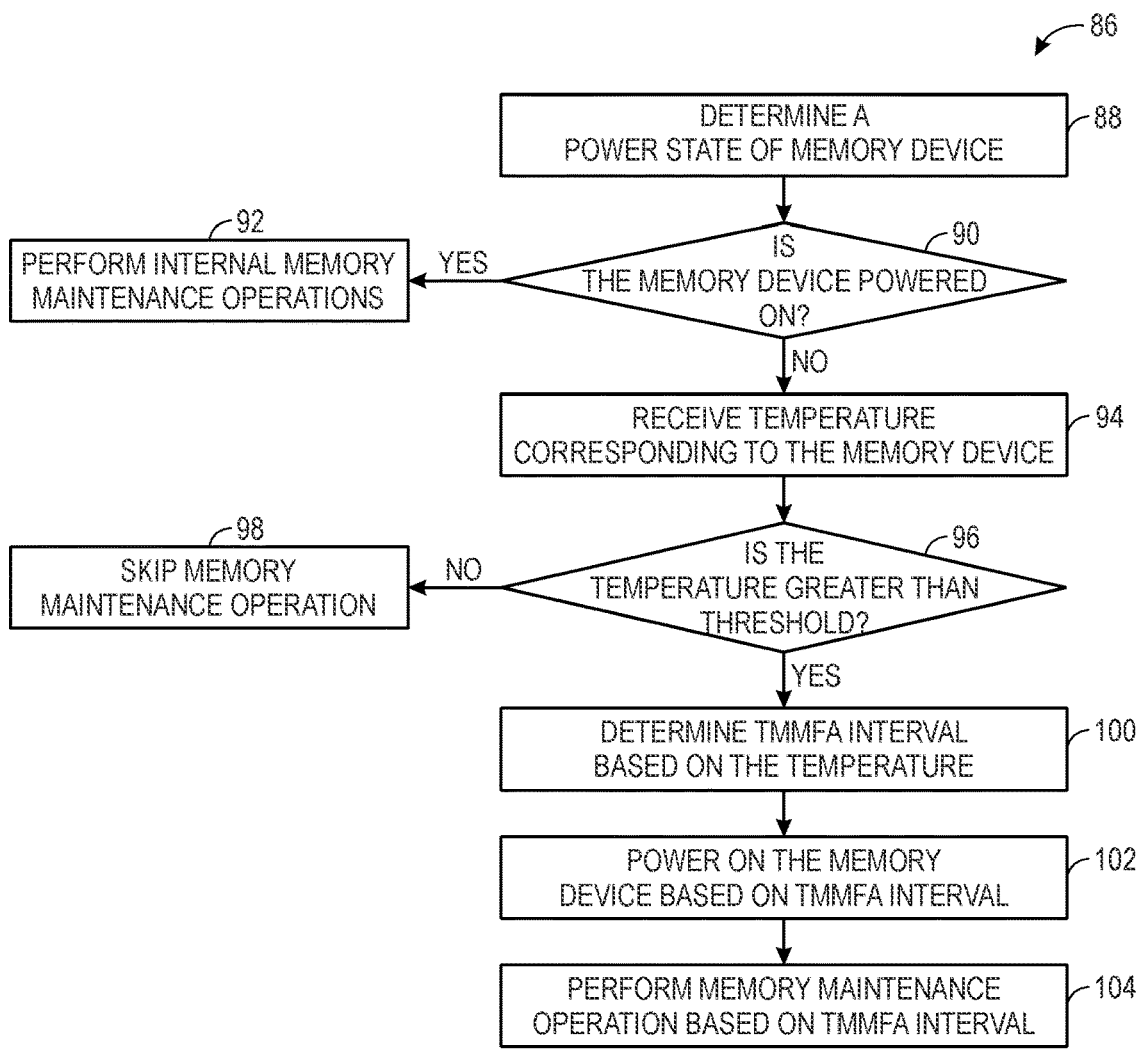
FIG. 3 illustrates a diagrammatic representation of an example look-up table that associates a memory temperature with a memory maintenance interval (tMMFA) parameter, in accordance with an embodiment of the present disclosure.
FIG. 4 illustrates a flowchart of a method of implementing a memory maintenance operation based on a tMMFA parameter, in accordance with an embodiment of the present disclosure.

To elaborate, FIG. 3 illustrates a diagrammatic representation of an example table 70 that associates different potential memory temperature ranges 72 with memory maintenance interval (tMMFA) parameters 74. The table 70 may be accessed by the memory controller 16 using look-up operations, query operations, or the like. Indeed, the table 70 may be a diagrammatic representation of a look-up table. The memory controller 16 may adjust the tMMFA parameters 74 in response to the observed temperature changes of the memory device 12.

The table 70 may be generated on a per-memory device-basis and/or for a model of memory device 12. During manufacturing, the tMMFA parameter relationships used by the memory controller 16 to select a tMMFA parameter to follow for a given temperature may be identified through a testing procedure. The testing procedure may involve determining a duration of time that a particular memory device (e.g., memory device 12) is capable of maintaining data with a suitable amount of integrity for a given temperature.

The table 70 may be stored in a memory accessible by the memory controller 16, such as a local memory of the memory controller 16, a cache memory of the memory controller 16, or the like. The table 70 may be stored in a memory accessible by the memory controller 16 and/or a memory separate from the memory device 12 (such that the table 70 is accessible while the memory device 12 is powered-off).

In some embodiments, the table 70 is representative of memory device operation ratings, such as a maximum time (tMMFA) allowed between subsequent memory maintenance operations, like refresh operations. For example, for a given memory product or for a family of memory devices manufactured in a given technology, such as a non-volatile ferroelectric memory technology, a maximum tMMFA interval duration (e.g., in column 74 in table 70) may be specified depending on the temperature (e.g., ranges reported in column 72 of table 70) measured during a power-down or power-off period. The values specified for the memory device (e.g., memory device 12 in FIG. 1) may be taken into consideration to improve a likelihood of suitable operation of a system including the memory device and a controller (e.g., controller 16), as described herein. In some examples, the controller receives temperature data corresponding to the memory device and uses the temperature data to determine the tMMFA interval based on the temperature. For example, the controller 16 may receive temperature data measured by the sensing device 20 or by the sensing device 22 and may determine tMMFA interval from column 74 based on which of the temperature ranges of column 72 that the temperature data is determined as within. The controller 16 may perform memory maintenance operation based on tMMFA interval selected using the received temperature data. The controller 16 may apply the tMMFA interval immediately upon calculation, at a time according to a change schedule (e.g., when the controller 16 is scheduled to apply an updated tMMFA interval), or the like.

Based on the relationship captured in the table 70, the memory controller 16 may dynamically adjust how frequently the memory device 12 is refreshed in response to temperature changes of the memory device 12. To elaborate, FIG. 4 illustrates a flowchart 86 of a method of implementing a memory maintenance operation based on a tMMFA parameter. Although the flowchart 86 is shown as involving operations in a particular order, it should be understood that some of the operations may be performed in a different order and certain operations described may be omitted from being explicitly shown in a block as part of FIG. 4 and instead described herein. Furthermore, the operations of the flowchart 86 are described as performed by the memory controller 16. However, it should be understood that other suitable processing circuitry of an electronic device communicatively coupled to the memory device 12 may perform some or all of the operations represented via the flowchart 86.

At block 88, the memory controller 16 may determine a power state of the memory device 12. The memory device 12 may be powered-on, in the process of being powered off or in a reduced power state, or powered-off. The memory controller 16 may receive sensing data from a voltage sensing device and/or a current sensing device to identify when the memory device 12 is in one of the modes. In some cases, a register may be updated with a power state indication of the memory device 12 based on sensing data from one of the sensing devices and/or a status from the memory device 12 itself when powered on. The memory controller 16 may sense outputs from a power supply to determine whether the memory device 12 is consuming power. Based on the sensing data or data included in the register, at block 90, the memory controller 16 determines whether the memory device 12 is powered on. The memory controller 16 may do so by comparing the sensing data to expected data values, ranges, or threshold values to determine whether the sensing data indicates that the memory device 12 is powered-on, powered-off, or is in the process of being powered-on or powered-off. A threshold value used to determine that the memory device 12 is powered-off may correspond to a lower value than a threshold value used to determine that the memory device 12 is powered-on. The memory device 12 may not be in a powered-on power state while supplied with less than a full supply power (e.g., a full rated supply power). The memory device 12 being supplied a first amount of power less than a second amount of power (e.g., a rated power value for the memory device 12) may indicate that the memory device 12 is not fully powered on, and thus is turning off, turning on, or is turned off. While the memory device 12 is supplied with the second amount of power, the memory controller 16 may deem the memory device 12 as powered on. In some cases, thresholds of variance from the first amount of power and the second amount of power may be considered when evaluating the power state of the memory device 12.

When the memory controller 16 determines that the memory device 12 is powered on, at block 92, the memory controller 16 may perform internal memory maintenance operations, which may be considered memory maintenance operations performed while the memory device 12 is in a normal operational mode (e.g., normal maintenance operations). These normal memory maintenance operations may include the memory controller 16 or other circuitry performing internal memory management (MM) operations to preserve data integrity. The memory controller 16 may reference a first refresh interval to determine how often to refresh data stored in the memory device 12. The first refresh interval may correspond to an average memory maintenance time interval (tMMI). At a start of each tMMI, the memory controller 16 may issue a maintenance mode command to the memory device 12 to trigger refreshing, wear leveling, and/or other data preservation operations of at least a portion of the memory device 12. Wear leveling may involve reordering how data is stored in the memory device 12 to avoid relatively more used memory cells and/or portions of the memory device 12 as a method to extend device life. Refreshing data may involve reading out data from a memory cell 14 and writing the same data back to the memory cell 14 as a method to refresh a voltage stored in the memory cell 14. In some cases, one or more of the maintenance mode commands may be issued in advance of the start of the tMMI to ensure that at least the corresponding portion of the memory device 12 being refreshed in satisfaction with the tMMI. Each maintenance mode command issued reduces a number of maintenance mode commands to be performed by one.

When the memory controller 16 instead determines at block 90 that the memory device 12 is powered-off, at block 94, the memory controller 16 may prepare to use a memory maintenance full array interval (tMMFA), which defines a time period within which the memory controller 16 is to issue enough memory maintenance commands to refresh all memory cells of the memory array 10. The tMMFA may be longer than the tMMI. At block 94, the memory controller 16 may receive temperature data corresponding to the memory device 12. The sensing device 20, 22 may generate the temperature data and transmit the temperature data to the memory controller 16, directly, via storage of the temperature data into a register, or the like. The temperature data received may be a temperature measurement that corresponds to a relatively greatest temperature from the plurality of temperature measurements made over a sensing window.

At block 96, the memory controller 16 may determine whether the temperature data is greater than a temperature threshold. Referring back to FIG. 3, in this example, the memory controller 16 may compare a temperature represented by the temperature data to a temperature threshold (e.g., 55° C. or any suitable temperature threshold). Referring back to FIG. 4, when the temperature is less than the temperature threshold, the memory controller 16 may, at block 98, skip the memory maintenance operations since the memory device 12 is not expected to suffer data loss at temperatures below the temperature threshold.

When the memory controller 16 determines, at block 96, that the temperature is greater than the temperature threshold, at block 100, the memory controller 16 may determine memory management intervals (e.g., the tMMFA parameter) based on the temperature. Referring back to FIG. 3, multiple temperature ranges bounded by a temperature minimum and temperature maximum to identify which range includes the temperature data. Different ranges may correspond to different tMMFA parameters. For example, a temperature range spanning 55° C. to 65° C. (e.g., a first temperature range spanning a first temperature and a second temperature) corresponds to a tMMFA parameter equal to 14.75 hours while a temperature range spanning 65° C. to 75° C.

corresponds to a tMMFA parameter equal to 4.99 hours (e.g., a second temperature range spanning the second temperature and a third temperature). Referring back to FIG. 4, after determining which of the temperature ranges that the temperature falls into, the memory controller 16 may apply the corresponding tMMFA parameter to a memory management operations timeline to set when and how frequently the memory management operations are to be performed.

After applying the tMMFA parameter to the memory management operations, the memory controller 16 may apply the tMMFA parameter in its control operations. To elaborate, the memory controller 16 may monitor a system clocking signal or a system clock (e.g., a global or local time indication) and, based on the tMMFA parameter, determine when to power-on the memory device 12 if the memory device 12 is powered-off or in a reduced power state to enable a memory maintenance operation to be performed. At block 102, the memory controller 16 may power on the memory device 12 at the determined time. The memory controller 16 may determine to power on the memory device at a time suitably before a scheduled time to account for any warm-up or processing operations to occur before the memory device 12 is able to be used. At block 104, the memory controller 16 may perform a memory maintenance operation to the powered-on memory device 12 at an interval corresponding to the tMMFA parameter. Thus, the memory controller 16 may power on the memory device 12 for a duration of time suitable to perform the memory maintenance operations and may power off the memory device 12 and/or return the memory device 12 to its previous power state after the memory maintenance operations are finished. Reducing power to the memory device 12 after completion of the memory maintenance operations may occur in parallel with the memory controller 16 awaiting an indication to power on the memory device 12 to perform another memory maintenance operation and/or to access data stored in the memory device 12. By doing so, the memory controller 16 may control refreshing of data stored in the memory device 12 according to the tMMFA parameter determined based on the temperature of the memory device 12 while the memory device 12 is in a powered-off state and/or reduced power state.

In some cases, the memory controller 16 may selectively cause the memory device 12 to exit the power-down mode in portions or subsets of the memory device 12. The memory controller 16 may return full supply power to one or more portions of the memory device 12 to return some or all of the memory device 12 to a powered-on state. The memory controller 16 may operate the memory device 12 wholly or partially (e.g., a portion of the memory device 12) into a powered-on state or powered-on power mode based on a respective time lapsed from last memory maintenance operation and/or a measured temperature of one or more portions of the memory device 12. Each memory portion, such as a memory plane, section, bank or page, may be independently maintained (e.g., refreshed) at respective intervals not exceeding tMMFA values, where the tMMFA may be respectively set for that memory portion. Furthermore, the memory controller 16 may immediately apply the tMMFA parameter or may wait until conclusion of an ongoing interval before changing the timing of the interval to apply the updated tMMFA parameter. Indeed, the memory controller 16 may compare an indication of a present time to an indication of a memory maintenance operation start time set based on the tMMFA value to determine when to start issuing memory maintenance operation commands. Performing a memory maintenance operation may involve the memory controller 16 sending different commands to refresh different memory cells 14.

A frequency at which the tMMFA value is updated may depend on how frequently the memory controller 16 is receiving the temperature at block 94 for subsequent operations. Indeed, the sensing devices 20, 22 may repeat sensing operations according to read intervals that may be set based on temperature gradients.

Using a sensing interval time definition (tTSI) and the temperature gradient, the memory controller may determine which sensing interval to use to obtain updated temperature data from the first sensing device and/or the second sensing device. For example, the memory controller may receive an interval time definition corresponding to a default sensing period as the tTSI and may receive an indication of a temperature gradient of the memory device. The memory controller may adjust the temperature gradient to a set temperature rise (e.g., a 10° C. rise) to generate an adjusted temperature gradient and may determine a read interval based on which of the adjusted temperature gradient or the interval time definition has a smaller time value. Using the newly determined read interval, the memory controller may at some point read an additional temperature measurement from a sensing device in response to an amount of time equal to the read interval passing.

Figure 5:
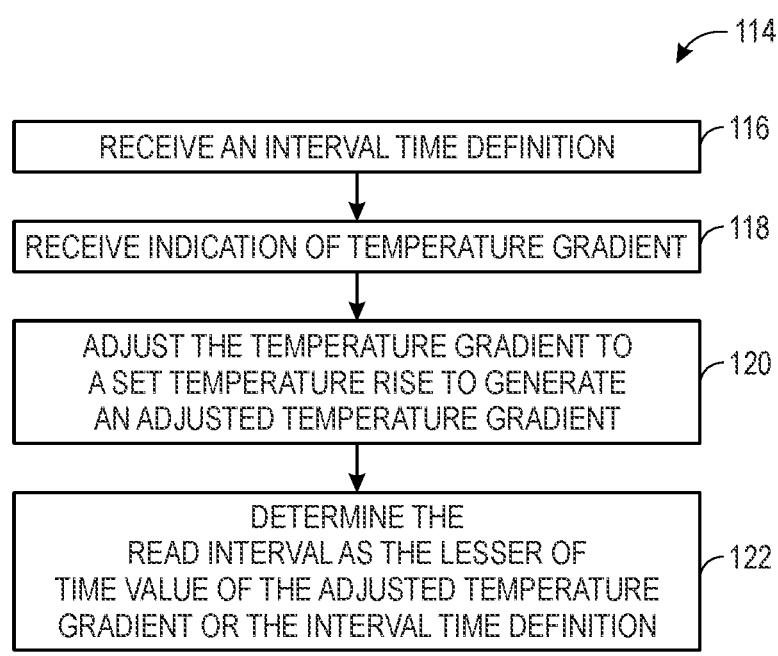
FIG. 5 illustrates a flowchart of a method of implementing variable sensing intervals based on a temperature gradient, in accordance with an embodiment of the present disclosure.

To elaborate, FIG. 5 illustrates a flowchart 114 of a method of implementing read intervals set based on a temperature gradient. Although the flowchart 114 is shown as involving operations in a particular order, it should be understood that some of the operations may be performed in a different order and certain operations described may be omitted from being explicitly shown in a block as part of FIG. 5 and instead described herein. Furthermore, the operations of the flowchart 114 are described as performed by the memory controller 16. However, it should be understood that other suitable processing circuitry of an electronic device communicatively coupled to the memory device 12 may perform some or all of the operations represented via the flowchart 114.

At block 116, the memory controller 16 may receive a sensing interval time definition (tTSI) corresponding to a time interval observed when implementing memory management operations in a normal operation of the memory device 12. This may be a default sensing parameter set with the memory device 12 during manufacturing. The tTSI may be an indication of any suitable value, such as 10 seconds (s). The memory controller 16 may be said to have received a first tTSI interval indication corresponding to internal memory maintenance operations when receiving the interval time definition.

At block 118, the memory controller 16 may receive (or determine) a temperature gradient. The sensing device 20, sensing device 22, and/or the memory controller 16 may determine a rate of change of the temperature. The memory controller 16 and/or the sensing devices 20, 22 may use multiple readings of temperature data to identify the temperature gradient, which indicates a rate at which the temperature of the memory device is increasing or decreasing. The sensing devices 20, 22 may transmit an indication of the rate of change of the temperature as the temperature gradient to the memory controller 16. At block 120, the memory controller 16 may adjust the temperature gradient to a set temperature rise to generate an adjustment temperature gradient. The memory controller 16 may adjust the received temperature gradient (e.g., change in temperature divided by time period, 15°/10 seconds (s)) to have a maximum degree of temperature rise, such as a 10 degree rise (e.g., 10°/n-number of seconds), or other value of set temperature rise. For example, the adjusted temperature gradient may equal 10°/6.67 seconds so the 10° rise time may be considered 6.67 seconds. This may be considered a normalizing adjustment to make it less complex to compare temperature gradient between different measurements.

At block 122, the memory controller 16 may determine the read interval as the lesser value between the tTSI and the adjusted temperature gradient (e.g., 10° rise time). Here, if the tTSI received at block 116 is less than the adjusted temperature gradient found at block 120, the memory controller 16 may use the tTSI as the read interval used to determine a periodicity at which to instruct the sensing devices 20, 22 to obtain new sensing data. If the tTSI received at block 116 is greater than or equal to the adjusted temperature gradient found at block 120, the memory controller 16 may use the adjusted temperature gradient found at block 120 as the read interval used to determine a periodicity at which to instruct the sensing devices 20, 22 to obtain new sensing data. The memory controller 16 may prepare to receive updated sensing data based on the read interval, for example, the memory controller 16 may receive a temperature and/or a temperature gradient from a register at a start time corresponding to the read interval.

Referring back to block 92 of FIG. 4, during normal memory maintenance operations, the memory controller 16 may reference an indication of a stored refresh interval to determine how often to refresh data stored in the memory device 12. This operation may be based on a temperature of the memory device 12 received from the sensing device 22, such that a periodicity of the refresh operation (e.g., how quickly a refresh operation is repeated for a particular portion of the memory device 12) changes with temperature. Different or same time intervals between refresh operations may be used for the case when the memory device 12 is powered on and for the case when the memory device 12 is powered off. Indeed, in some cases, the memory controller 16 may reference the same tMMFA intervals of FIG. 3 during the normal memory maintenance operations as are referenced while the memory device 12 is transitioning between being powered-on and powered-off or is powered-off.

In some embodiments, the memory controller 16 may receive, as the temperature of block 94, a value corresponding to a maximum temperature sensed by the sensing device 20 and/or sensing device 22 over a temperature sensing time period. The sensing devices 20, 22 may include processing circuitry to determine a maximum temperature sensed over the temperature sensing time period to use as the temperature of block 94.

Temperature-based memory management operations may be similarly applied to fresh devices and end-of-life devices. In some cases, the look-up table 70 may be adjusted as the device ages. The memory controller 16 may track an age of the memory device 12 and apply different look-up table over time to compensate for any differences in performance to the age of the memory device 12.

In some cases, the operations of FIG. 4 are applied when the periodic tMMI commands of the internal memory maintenance operations of block 92 do not satisfy timing requirements defined by the look-up table 70 of FIG. 3. For example, referring to the values illustrated in the look-up table 70 of FIG. 3, a 50 ms long power down followed by a 50 ms long active time corresponds to 16 million transmitted tMMI commands in (presuming 12 microseconds (us) per command and each command is sent at different times and occurs over non-overlapping time periods) 12 us multiplied by 16 million and 2 to equal 402 seconds (s), which meets the tMMFA parameter for any temperature. As another example, presuming a 12 us command time and following the look-up table 70 of FIG. 3, a 990 ms long power down followed by a 10 ms long power-on time enables 16 million tMMI commands in 12 us multiplied by 16 million and 100 to equal 20,100 s or about 5.58 hours, which does not meet the tMMFA parameter at higher temperatures (e.g., temperatures greater than 75° C.). Thus, an adjusted duration is to be used for the second example and the tMMI command timing may be used for the first example. Thus, in some devices, the memory controller 16 may determine one or more settings defining intervals used to perform the internal memory maintenance operations of block 92. The memory controller 16 may determine whether the intervals would also satisfy the timing parameters of the look-up table 70 of FIG. 3 before performing operations of FIG. 4. By reusing the settings defining the intervals of the operations of block 92, the memory controller 16 may save time and consume fewer resources by reusing settings found compliant with tMMFA parameters. In some cases, further resources and time may be conserved by the memory controller 16 determining at what temperature(s) or within which temperature range(s) the tMMI command timings comply with some temperature tMMFA parameters but not others. The temperatures and/or temperature ranges may be implemented by the memory controller 16 as temperature thresholds. The memory controller 16 during a future operation may skip some or all of the tMMFA parameter determinations when a present temperature of the memory device is within a temperature range or crosses a temperature threshold indicating that the tMMI command timings (e.g., timing of the internal memory maintenance operation) satisfy the tMMFA definitions.

These systems and methods described herein improve memory operations by reducing a likelihood that an imprint operation during a high temperature power down and/or storage condition leads to data loss by performing memory maintenance operations based on a temperature of the memory device. Indeed, when a memory device is in power-off status (e.g., not consuming any power at all, switched-off, powered-off mode, powered-off state, powered-off), a memory controller powers the memory device on with suitable time to perform one or more memory maintenance operations on the memory device in compliance with a time interval having a duration based on a temperature of the memory device (e.g., a tMMFA parameter). The systems and methods based on the tMMFA parameter may enable data to be preserved in the memory cells even while a memory device is powered-off, is powered-on, or transitioning between being powered on or off (e.g., is being powered-on, is being powered-off). While both the memory device and the memory controller are powered-off, a room containing the memory device may be kept to an ambient temperature suitably low to maintain the memory device at a temperature less than a temperature threshold value (e.g., 55° C.). While the memory controller is powered on and while the memory device is powered off or is in the processing of powering on or powering off, the memory controller may perform memory management operations for each memory cell of the memory device based on the tMMFA parameter. The time interval used as the tMMFA parameter to time the memory management operations may be adjusted in response to temperature fluctuations of the memory device. The temperature of the memory device may be determined using a sensing device located on the memory device or using a sensing device of the memory controller. The different sensing devices may be used based on whether the sensing device of the memory device is powered and able to perform a sensing operation. These systems and methods may enable a memory controller to perform memory management operations at configurable intervals based on a temperature of the memory device during power transition operational modes (e.g., when the memory device is being powered-off or is being powered-on) and/or during different power modes (e.g., when the memory device is powered-off) to refresh data more often as the temperature of the memory device increases and less often as the temperature of the memory device decreases closer to a threshold temperature value. These systems and methods may be applied to a variety of memory devices including both two-dimensional memories and/or three-dimensional memories (e.g., cross-point memories) to improve robustness of operations of the different memory devices.

With these technical effects in mind, multiple memory devices may be included on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. Or in some cases, a memory controller may be used on the host-side of a memory-host interface; for example, a processor, microcontroller, field programmable gate array (FPGA), application-specific integrated circuit (ASIC), or the like may each include a memory controller.

This communication network may enable data communication there between and, thus, the client device to utilize hardware resources accessible through the memory controller. Based at least in part on user input to the client device, processing circuitry of the memory controller may perform one or more operations to facilitate the retrieval or transmission of data between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, memory controller operations, and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 20(f). However, for any claims containing elements designated in any other manner, it is intended that such elements are not to be interpreted under 35 U.S.C. 20(f).

What is claimed is:

1. A system, comprising:
  a memory device configured to be supplied a first amount of power less than a second amount of power supplied when the memory device is powered-on; and
  a memory controller communicatively coupled to the memory device, wherein the memory controller is configured to:
    receive a temperature measurement indicative of a present temperature of the memory device while the memory device is supplied the first amount of power;
    determine a memory management interval based on the temperature measurement at least in part by:
      receiving an interval time definition corresponding to a time interval observed when implementing memory management operations in a normal operation of the memory device;
      receiving an indication of a temperature gradient of the memory device;
      adjusting the temperature gradient to a set temperature rise to generate an adjusted temperature gradient; and
      determining a read interval based on which of the adjusted temperature gradient or the interval time definition comprises a smaller time; and
    send a plurality of memory management commands to the memory device at different times within a duration of time equal to the memory management interval.

2. The system of claim 1, wherein each of the plurality of memory management commands are respectively configured to cause the memory device to refresh respective memory cells of a plurality of memory cells of the memory device.

3. The system of claim 1, wherein the memory controller is configured to:
  receive the temperature measurement from a first sensing device thermally coupled to a first chip of the memory device while the memory device is receiving the second amount of power, wherein the memory device is physically disposed on the first chip, is physically integrated into the first chip, or both; and
  receive the temperature measurement from a second sensing device thermally coupled to a second chip of the memory controller while the memory device is not receiving the second amount of power, wherein the memory controller is physically disposed on the second chip, is physically integrated into the second chip, or both.

4. The system of claim 1, wherein the memory controller is configured to:
  receive a plurality of temperature measurements; and
  select a maximum temperature from the plurality of temperature measurements to use as the temperature measurement.

5. The system of claim 1, wherein the memory management interval defines an amount of time within which each memory cell of the memory device is to be refreshed.

6. The system of claim 1, wherein the memory controller is configured to:

receive a power measurement associated with the memory device;

determine that the memory device is not powered on based on the power measurement comprising the first amount of power; and in response to determining that the memory device is not powered on, receive the temperature measurement.

7. The system of claim 1, wherein the memory controller is configured to:

read an additional temperature measurement from a sensing device in response to an amount of time equal to the read interval passing.

8. A method comprising:

receiving a temperature measurement indicative of a present temperature of a memory device at least in part by:

receiving the temperature measurement from a first sensing device thermally coupled to a first chip of the memory device while the memory device is receiving a first amount of power, wherein the memory device is physically disposed on the first chip, is physically integrated into the first chip, or both, and wherein the memory device is configured to be supplied the first amount of power supplied when the memory device is powered-on; and receiving the temperature measurement from a second sensing device thermally coupled to a second chip of a memory controller while the memory device is not receiving the first amount of power, wherein the memory controller is physically disposed on the second chip, is physically integrated into the second chip, or both;

determining that the temperature measurement is greater than a temperature threshold;

in response to determining that the temperature measurement is greater than the temperature threshold, determining a memory management interval based on the temperature measurement; and sending a plurality of memory management commands to the memory device at different times within a duration of time equal to the memory management interval.

9. The method of claim 8, comprising selecting the temperature threshold to equal 55 degrees Celsius (° C.).

10. The method of claim 8, comprising:

receiving a first interval indication corresponding to internal memory maintenance operations;

determining whether the first interval indication is greater than or equal to the memory management interval; and in response to the first interval indication being greater than or equal to the memory management interval, generating the plurality of memory management commands.

11. The method of claim 10, comprising:

determining a power state of the memory device; and receiving the temperature measurement in response to the power state corresponding to the memory device being powered on or powered off.

12. The method of claim 11, wherein determining the memory management interval based on the temperature measurement comprises:

retrieving a relationship between a plurality of temperatures and a plurality of memory management intervals; and determining the memory management interval based on the relationship.

13. A tangible, non-transitory computer readable medium comprising instructions that, when executed by a processor, cause a memory controller to perform operations comprising:

receiving a plurality of temperature measurements indicative of a temperature of a memory device over a sensing period;

determining a temperature measurement from the plurality of temperature measurements, wherein the temperature measurement corresponds to a relatively greatest temperature from the plurality of temperature measurements;

determining a memory management interval based on the temperature measurement;

causing power to be supplied to the memory device to send a plurality of memory management commands to the memory device within a duration of time equal to the memory management interval;

receiving an indication of an average memory maintenance time interval;

determining whether the average memory maintenance time interval is greater than or equal to the memory management interval; and in response to the average memory maintenance time interval being greater than or equal to the memory management interval, generating the plurality of memory management commands.

14. The tangible, non-transitory computer readable medium of claim 13, wherein the operations comprise:

determining a power state of the memory device; and receiving the temperature measurement in response to the power state corresponding to the memory device being supplied less than a full supply power.

15. The tangible, non-transitory computer readable medium of claim 14, wherein the operations of determining the memory management interval based on the temperature measurement comprise:

retrieving a look-up table comprising a plurality of temperatures associated with a plurality of memory management intervals; and determining the memory management interval based on the look-up table.

16. The tangible, non-transitory computer readable medium of claim 15, wherein determining the memory management interval based on the look-up table comprises:

comparing the temperature measurement to a plurality of temperature ranges corresponding to the plurality of temperatures; and selecting the memory management interval based on which of the plurality of temperature ranges the temperature measurement is within.

17. The tangible, non-transitory computer readable medium of claim 15, wherein the operations to send the plurality of memory management commands to the memory device comprise determining the plurality of memory management commands based on a type of the memory device.

* * * * *